United States Patent
Wang et al.

(10) Patent No.: US 11,240,923 B2
(45) Date of Patent: Feb. 1, 2022

(54) FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Fang Wang, Hubei (CN); Zhuo Zhang, Hubei (CN); Wen Han, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/771,247

(22) PCT Filed: Jun. 10, 2019

(86) PCT No.: PCT/CN2019/090484
§ 371 (c)(1),
(2) Date: Jun. 10, 2020

(87) PCT Pub. No.: WO2020/220433
PCT Pub. Date: Nov. 5, 2020

(65) Prior Publication Data
US 2021/0076517 A1    Mar. 11, 2021

(30) Foreign Application Priority Data

Apr. 30, 2019 (CN) .......................... 201910362478.1

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC . H05K 5/0217; H05K 5/0017; H04M 1/0237; H04M 1/0268; G06F 1/1616; G06F 1/1652; G09F 9/301
See application file for complete search history.

(56) References Cited

U.S. PATENT DOCUMENTS

| 10,136,524 | B2* | 11/2018 | Choi | H05K 5/0217 |
| 10,881,009 | B2* | 12/2020 | Jiang | H05K 5/0017 |
| 10,938,970 | B1* | 3/2021 | Lee | H04M 1/0237 |

(Continued)

*Primary Examiner* — Hung S. Bui
*Assistant Examiner* — Sagar Shrestha
(74) *Attorney, Agent, or Firm* — Mark M. Friedman

(57) ABSTRACT

The present application provides a flexible display device, including a housing, at least one winding mechanism, a flexible display screen and at least one stretching mechanism. When the flexible display screen is in a first state, the stretching mechanism pulls the winding mechanism to pull the flexible display screen out of the winding mechanism; when the flexible display screen is in a second state, the stretching mechanism pulls the winding mechanism to receive the flexible display screen into the winding mechanism. The flexible display device is smaller in size by winding the flexible display screen in the housing.

18 Claims, 9 Drawing Sheets

(56) References Cited

U.S. PATENT DOCUMENTS

| | | | | |
|---|---|---|---|---|
| 2004/0052044 | A1* | 3/2004 | Mochizuki | G06F 1/1679 |
| | | | | 361/679.15 |
| 2007/0146243 | A1* | 6/2007 | Ou Yang | G06F 1/1601 |
| | | | | 345/76 |
| 2011/0176260 | A1* | 7/2011 | Walters | G06F 1/1641 |
| | | | | 361/679.01 |
| 2012/0212433 | A1* | 8/2012 | Lee | G06F 3/041 |
| | | | | 345/173 |
| 2012/0314400 | A1* | 12/2012 | Bohn | G06F 1/1652 |
| | | | | 362/97.1 |
| 2013/0058063 | A1* | 3/2013 | O'Brien | G06F 1/1652 |
| | | | | 361/807 |
| 2016/0062408 | A1* | 3/2016 | Lee | G06F 1/1616 |
| | | | | 345/173 |
| 2016/0100478 | A1* | 4/2016 | Lee | G06F 1/1624 |
| | | | | 361/749 |
| 2016/0216737 | A1* | 7/2016 | Hayk | G06F 1/1626 |
| 2016/0366772 | A1* | 12/2016 | Choi | G06F 1/1652 |
| 2018/0014417 | A1* | 1/2018 | Seo | H05K 1/189 |
| 2018/0098440 | A1* | 4/2018 | Choi | H05K 5/0017 |
| 2018/0103552 | A1* | 4/2018 | Seo | G06F 1/1624 |
| 2019/0243424 | A1* | 8/2019 | Lee | G06F 1/1679 |
| 2019/0259310 | A1* | 8/2019 | Ha | H01L 51/56 |
| 2020/0196460 | A1* | 6/2020 | Myers | G06F 1/1652 |
| 2020/0363841 | A1* | 11/2020 | Kim | G06F 1/1624 |

* cited by examiner a b a b a b

FLEXIBLE DISPLAY DEVICE

CROSS-REFERENCE TO RELATED APPLICATIONS

This application is a U.S. national phase application of a PCT Application No. PCT/CN2019/090484 filed on Jun. 10, 2019, which claims priority to Chinese Application No. 201910362478.1 filed on Apr. 30, 2019, the disclosures of which are incorporated in their entirety by reference herein.

FIELD OF THE INVENTION

The present application relates to a display technology field, and more particularly to a flexible display device.

BACKGROUND OF THE INVENTION

The flexible display device possesses the advantages of good bending resistance, and can be made smaller and smaller in size by folding and curling, and thus is more and more favored by the market.

The existing flexible display device mainly adopts the inner bending manner or the outer bending manner to accommodate the flexible display screen. However, the flexible display device folded in foregoing two manners is still large in size and cannot meet the portable requirement.

Therefore, the existing flexible display device has a technical problem that the curled flexible display screen is still large and needs to be improved.

SUMMARY OF THE INVENTION

The present application provides a flexible display device to solve a technical problem that the curled flexible display screen of the flexible display device is still large.

To solve the aforesaid problem, the technical solution of the present application is described as follows:

The present application provides a flexible display device, including:

a housing having a receiving cavity formed therein, wherein an opening is formed on at least one of two opposite side edges of the receiving cavity;

at least one winding mechanism disposed in the receiving cavity;

a flexible display screen disposed outside the housing, wherein one end of the flexible display screen extends into the opening and is connected to the winding mechanism; and at least one stretching mechanism disposed in the receiving cavity, wherein each of the stretching mechanisms is connected to one of the winding mechanisms;

wherein when the flexible display screen is in a first state, the stretching mechanism pulls the winding mechanism to move in a direction away from the housing to pull the flexible display screen out of the winding mechanism; when the flexible display screen is in a second state, the stretching mechanism pulls the winding mechanism to move in a direction toward the housing to receive the flexible display screen into the winding mechanism.

In the flexible display device of the present application, the housing includes a first housing, a second housing and a connecting member connecting the first housing and the second housing, and a first receiving cavity is formed inside the first housing and a second receiving cavity is formed inside the second housing, and at least one of the first receiving cavity and the second receiving cavity is formed with an opening on a side away from the connecting member, wherein when the flexible display screen is in the first state, the first housing and the second housing are unfolded around the connecting member, and when the flexible display screen is in the second state, the first housing and the second housing are folded around the connecting member.

In the flexible display device of the present application, the winding mechanism includes a winding member and a first roller having parallel axes and not contacting each other, and the first roller is disposed between the winding member and the opening, and the winding member and the first roller are fixed on the stretching mechanism, and one end of the flexible display screen is connected to the winding member around the first roller and extends from the opening out of the housing.

In the flexible display device of the present application, the winding member is a coil spring.

In the flexible display device of the present application, the winding mechanism further includes a driving member, and the drive member drives the winding member to pull or retract the flexible display screen from the housing.

In the flexible display device of the present application, the winding mechanism further includes a second roller, and the second roller and the first roller are disposed on two sides of the winding member, and a distance between the second roller and the opening is greater than a distance of the first roller from the opening, and the axis of the first roller and an axis of the second roller are parallel, and the one end of the flexible display screen is connected to the winding member around the second roller and the first roller in sequence and extends from the opening out of the housing.

In the flexible display device of the present application, a diameter of the first roller is equal to or greater than a diameter of the second roller.

In the flexible display device of the present application, the winding mechanism further includes a third roller, and the third roller is disposed between the first roller and the winding member, and an axis of the third roller and the axis of the first roller are parallel, and the one end of the flexible display screen is connected to the winding member around the third roller, the second roller and the first roller in sequence and extends from the opening out of the housing.

In the flexible display device of the present application, a diameter of the third roller is less than or equal to a diameter of the second roller.

In the flexible display device of the present application, the stretching mechanism is a drawer, and a slider is disposed on the drawer, and a corresponding slide rail is disposed on the housing, and the slider slides along the slide rail.

In the flexible display device of the present application, the slider is a draw slip or a pulley.

In the flexible display device of the present application, the slide rail is disposed on a bottom side of the housing.

In the flexible display device of the present application, the slide rail is disposed on a lateral side of the housing.

In the flexible display device of the present application, a pull rod is further disposed on the drawer.

In the flexible display device of the present application, the flexible display device further includes a limiting plate disposed on a bottom side of the housing.

In the flexible display device of the present application, the flexible display device further includes a support layer, and the flexible display screen is disposed on the support layer.

In the flexible display device of the present application, a thickness of the support layer is 30 microns.

In the flexible display device of the present application, a material of the support layer is stainless steel.

In the flexible display device of the present application, the flexible display device further includes an adhesive layer, and the adhesive layer is disposed between the support layer and the flexible display screen, and the flexible display screen is fixed to the support layer by the adhesive layer.

In the flexible display device of the present application, a material of the adhesive layer is optical glue.

The benefits of the present application are: the present application provides a flexible display device, including a housing, at least one winding mechanism, a flexible display screen and at least one stretching mechanism, wherein a receiving cavity is formed in the housing, and an opening is formed on at least one of two opposite side edges of the receiving cavity; at least one winding mechanism disposed in the receiving cavity; a flexible display screen disposed outside the housing, wherein one end of the flexible display screen extends into the opening and is connected to the winding mechanism; and at least one stretching mechanism disposed in the receiving cavity, wherein each of the stretching mechanisms is connected to one of the winding mechanisms; wherein when the flexible display screen is in a first state, the stretching mechanism pulls the winding mechanism to move in a direction away from the housing to pull the flexible display screen out of the winding mechanism; when the flexible display screen is in a second state, the stretching mechanism pulls the winding mechanism to move in a direction toward the housing to receive the flexible display screen into the winding mechanism. By providing the stretching mechanism and the winding mechanism, the flexible display screen is wound up in the housing when not in use, the entire flexible display device is smaller in size, and the housing can protect the internal flexible display screen from damage.

BRIEF DESCRIPTION OF THE DRAWINGS

In order to more clearly illustrate the embodiments of the present application and the prior art, the following figures will be described in the embodiments and the prior art are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Figure 1:
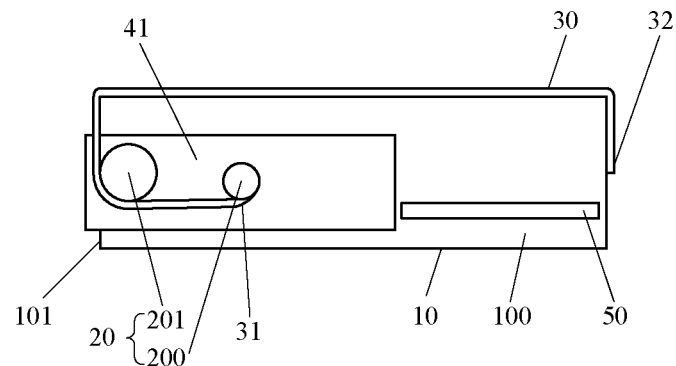
FIG. 1 is a first structure diagram of a flexible display device provided by the embodiment of the present application.

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to appended figures. Thus, the used directional terms are used to describe and understand the present application, but the present invention is not limited thereto. In the figure, units with similar structures are denoted by the same reference numerals.

The present application provides a flexible display device to solve a technical problem that the curled flexible display screen of the flexible display device is still large.

As shown in FIG. 1, it is a first structure diagram of a flexible display device provided by the embodiment of the present application. The flexible display device includes a housing 10, a winding mechanism, a flexible display screen 30 and a stretching mechanism.

The housing 10 has a receiving cavity 100 formed therein, and an opening is formed on at least one of two opposite side edges of the receiving cavity 100.

At least one winding mechanism is disposed in the receiving cavity 100.

The flexible display screen 30 is disposed outside the housing 10, and one end of the flexible display screen 30 extends into the opening and is connected to the winding mechanism.

The first winding mechanism 21 pulls the flexible display screen 30 into or out of the housing 10 by collapsing and releasing.

At least one stretching mechanism is disposed in the receiving cavity 100. Each of the stretching mechanisms is connected to one of the winding mechanisms. Namely, a number of stretching mechanisms is equal to a number of winding mechanisms, and each stretching mechanism is used in conjunction with a winding mechanism.

When the flexible display screen 30 is in a first state, the stretching mechanism pulls the winding mechanism to move in a direction away from the connecting member 13 to pull the flexible display screen 30 out of the winding mechanism. When the flexible display screen 30 is in a second state, the stretching mechanism pulls the winding mechanism to move in a direction toward the connecting member 13 to receive the flexible display screen 30 into the winding mechanism.

A number of openings in the housing 10 may be one or two, and the number of the winding mechanism and the number of the stretching mechanism are equal to a number of the openings. The flexible display screen 30 has different receiving methods when the number of openings is different.

In this embodiment, the number of openings is one. As shown in FIG. 1, the housing 10 is generally a hollow cubic structure that internally forms the receiving cavity 100. A first opening 101 is formed on a left lateral side of the receiving cavity 100, and a size of the first opening 101 is smaller than or equal to a size of the lateral side of the housing.

In one embodiment, no lateral side is provided on the left of the housing 10, where the first opening 101 is formed directly.

In one embodiment, one lateral side is provided on the left of the housing 10, first. Then, the first opening 101 is formed by digging holes on the lateral side, and the shape and the size of the first opening 101 can be designed as needed.

A first winding mechanism 21 and a first stretching mechanism 41 are disposed in the receiving cavity 100.

The first winding mechanism 21 includes a first winding member 210 and a first roller 211 having parallel axes and not contacting each other, and the first roller 211 is disposed between the first winding member 210 and the first opening 101, and the first winding member 210 and the first roller 211 are fixed on the first stretching mechanism 41, and a first end 31 of the flexible display screen 30 is connected to the first winding member 210 around the first roller 211 and extends from the first opening 101 out of the housing 10. A second end 32 of the flexible display screen 30 can be fixed on a right lateral side of the housing 10, or a slit is formed on the right lateral side of the housing 10. The second end 32 extends from the slit into the interior of the housing 10 and is fixed.

The first winding member 210 is used to pull the flexible display screen 30 into or out of the housing 10. The first winding member 210 may be automatically contracted or may be contracted by an external force.

In one embodiment, the first winding member 210 is a coil spring. The coil spring can continue to provide greater resilience in a small space to automatically pull the flexible display screen into the housing 10 when the flexible display screen 30 needs to be received.

In one embodiment, the flexible display device further includes a driving member (not shown) that drives the first winding member 210 to pull or retract the flexible display screen 30 from the housing 10. The driving member may be a structure that provides a driving force, such as a motor.

By providing the first roller 221, in the process that the flexible display screen 30 starts from the first winding member 210 around the first roller 211 and then extends out of the housing 10, due to a certain distance between the first winding member 210 and the first roller 211, the flexible display screen 30 is only partially wound around the first winding member 210 and the first roller 211 in the housing 10, and the rest is still unfolded. Such winding manner causes the flexible display screen 30 to be less curled. The force applied to the flexible display screen 30 as retracting and extending is also small. The flexible display screen is not easily damaged.

The first stretching mechanism 41 is movable in a direction away from the housing 10 and toward the housing 10. Since the first stretching mechanism 41 and the first winding mechanism 21 are connected to each other and are used in conjunction. When the flexible display screen 30 is in the first state, the first stretching mechanism 41 pulls the first winding mechanism 21 to move in the direction away from the housing 10 to pull the flexible display screen 30 out of the first winding mechanism 21; when the flexible display screen 30 is in the second state, the first stretching mechanism 41 pulls the first winding mechanism 21 to move in the direction toward the housing 10 to receive the flexible display screen 30 into the first winding mechanism 21.

In the process of pulling and receiving, the second end 32 of the flexible display screen 30 is always fixed to the other side of the housing 10. The first end 31 of the flexible display screen 30 is pulled and received from the first winding mechanism 21 by the first stretching mechanism 41, thus to control the size of the display surface of the flexible display screen 30 outside the housing 10.

In one embodiment, the flexible display device further includes a support layer (not shown). The flexible display screen 30 is disposed on the support layer. An area of the flexible display screen 30 may be equal to an area of the support layer or may be smaller than the area of the support layer. When the flexible display screen 30 is switched between the first state and the second state, the support layer can be used to protect the flexible display screen 30 from damage to the flexible display screen 30 during stretching.

The support layer is usually a rectangular structure, and its bending and curling properties are good, and the amount of stretching is small under a certain tensile force. Generally, the support layer is made of stainless steel or amorphous material. In one embodiment, the support layer has a thickness of 30 microns.

The flexible display device further includes an adhesive layer (not shown), and the adhesive layer is disposed between the support layer and the flexible display screen 30, and the flexible display screen 30 is fixed to the support layer by the adhesive layer. A material of the adhesive layer may be optical glue. The flexible display screen 30 and the support layer are adhered by curing the adhesive layer. However, the present application is not limited thereto, and other materials that can fix the flexible display screen 30 on the support layer can form the adhesive layer.

In one embodiment, the flexible display device further includes a limiting plate 50. The limiting plate 50 is disposed on a bottom side of the housing 10 or may be disposed on the lateral side of the housing 10.

When the first stretching mechanism 41 slides toward the housing 10, in order to avoid excessive sliding distance, the limiting plate 50 is disposed in the housing 10 to ensure that the first stretching mechanism 41 is blocked after sliding to an appropriate position, and cannot continue to slide. Accordingly, the first end 31 of the flexible display screen 30 is protected from colliding with the right side of the housing 10 to cause damage.

By providing the stretching mechanism and the winding mechanism, the flexible display screen 30 is wound up in the housing 10 when not in use and the flexible display screen 30 is pulled out of the housing 10 when in use to flexibly control the display area of the flexible display screen 30, and the entire flexible display device is smaller in size after storage, and the housing 10 can protect the internal flexible display screen 30 from damage.

Figure 2:
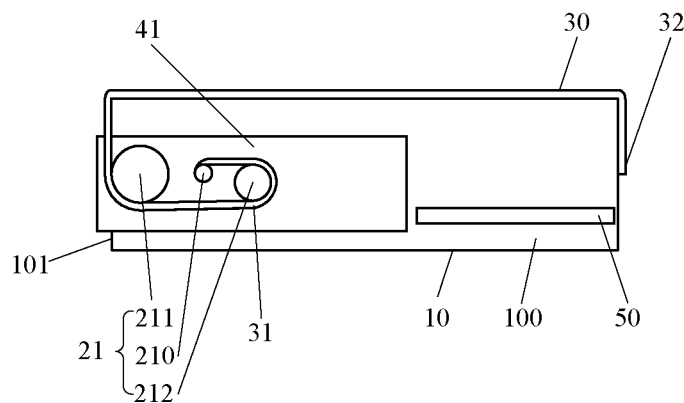
FIG. 2 is a second structure diagram of a flexible display device provided by the embodiment of the present application.

As shown in FIG. 2, it is a second structure diagram of a flexible display device provided by the embodiment of the present application. The flexible display device includes a housing 10, a winding mechanism, a flexible display screen 30 and a stretching mechanism.

The difference from the structure in FIG. 1 is that, in this embodiment, the first winding mechanism 21 further includes a second roller 212, and the second roller 212 and the first roller 211 are disposed on two sides of the first winding member 210. A distance between the second roller 212 and the first opening 101 is greater than a distance of the first roller 211 from the first opening 101, and an axis of the first roller 211 and an axis of the second roller 212 are parallel, and the first end 31 of the flexible display screen 30 is connected to the first winding member 210 around the second roller 212 and the first roller 211 in sequence and finally extends out from the first opening 101.

A diameter of the first roller 211 is equal to or greater than a diameter of the second roller 212. Thus, the flexible display screen 30 does not contact with the first winding member 210 in a path wound from the second roller 212 to the first roller 211, thereby preventing the flexible display screen 30 from being damaged.

Figure 3:
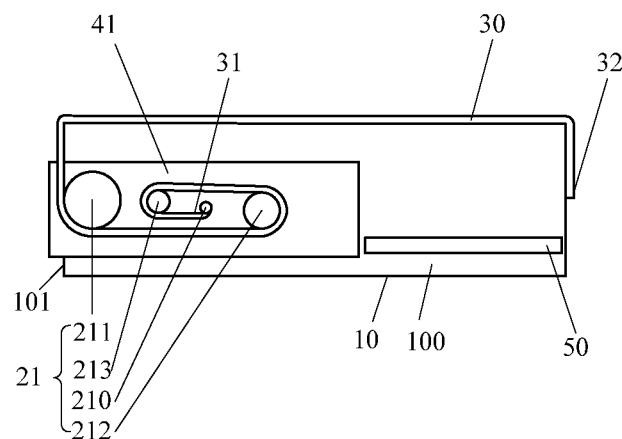
FIG. 3 is a third structure diagram of a flexible display device provided by the embodiment of the present application.

As shown in FIG. 3, it is a third structure diagram of a flexible display device provided by the embodiment of the present application. The flexible display device includes a housing 10, a winding mechanism, a flexible display screen 30 and a stretching mechanism.

The difference from the structure in FIG. 2 is that, in this embodiment, the first winding mechanism 21 further includes a third roller 213, and the third roller 213 is disposed between the first roller 211 and the first winding member 210. An axis of the third roller 213 and an axis of the first roller 211 are parallel, and the first end 31 of the flexible display screen 30 is fixed to the first winding member 210 around the third roller 213, the second roller 212 and the first roller 211 in sequence and finally extends out from the first opening 101.

In one embodiment, the axes of the first roller 211, the second roller 212 and the third roller 213 are at the same horizontal plane. A diameter of the third roller 213 is smaller than or equal to the diameter of the second roller 212, and the diameter of the second roller 212 is larger than the diameter of the first roller 211. Thus, the flexible display screen 30 does not contact with the first winding member 210 in a path wound from the third roller 213 to the second roller 212 and then to the first roller 211, thereby preventing the flexible display screen 30 from being damaged.

Figure 4:
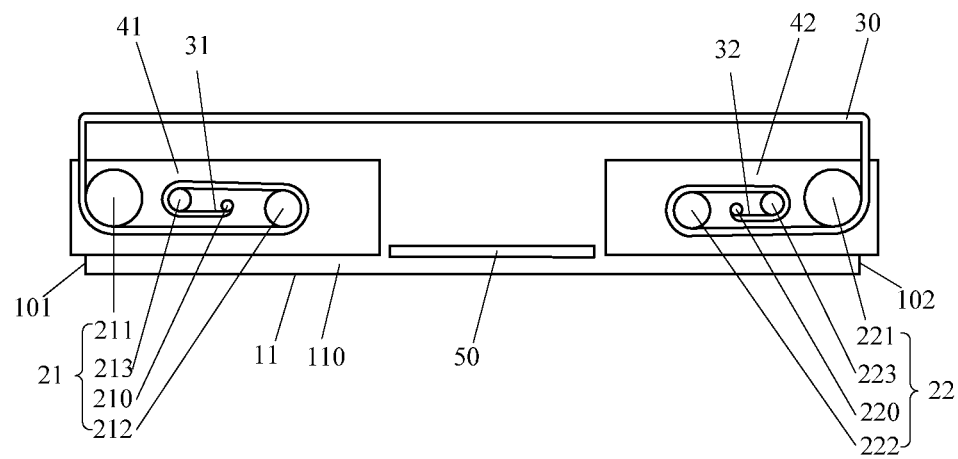
FIG. 4 is a fourth structure diagram of a flexible display device provided by the embodiment of the present application.

As shown in FIG. 4, it is a fourth structure diagram of a flexible display device provided by the embodiment of the present application. The flexible display device includes a housing 10, a winding mechanism, a flexible display screen 30 and a stretching mechanism.

In this embodiment, two openings are formed in the housing 10. As shown in FIG. 2, a first opening 101 is formed on the left side of the receiving cavity 100, and a second opening 102 is formed on the opposite right side. In the receiving cavity 100, a first winding mechanism 21 and a first stretching mechanism 41 are disposed on the left side, and a second winding mechanism 22 and a second stretching mechanism 42 are disposed on the right side. The first stretching mechanism 41 is connected to the first winding mechanism 21, and the second stretching mechanism 42 is connected to the second winding mechanism 22.

A first end 31 of the flexible display screen 30 extends into the first opening 101 and is connected to the first winding mechanism 21. The second end 32 of the flexible display screen 30 extends into the second opening 102, and is connected to the second winding mechanism 22. Both the first stretching mechanism 41 and the second stretching mechanism 42 are movable in a direction away from the housing 10 and toward the housing 10.

When the flexible display screen 30 is in the first state, the first stretching mechanism 41 pulls the first winding mechanism 21 to move in the direction away from the housing 10, i.e. to the left in FIG. 2, to pull the flexible display screen 30 out of the first winding mechanism 21, and meanwhile, the second stretching mechanism 42 pulls the second winding mechanism 22 to move in the direction away from the housing 10, i.e. to the right in FIG. 2, to pull the flexible display screen 30 out of the second winding mechanism 22;

when the flexible display screen 30 is in the second state, the first stretching mechanism 41 pulls the first winding mechanism 21 to move in the direction toward the housing 10, i.e. to the right in FIG. 2, to receive the flexible display screen 30 into the first winding mechanism 21, and meanwhile, the second stretching mechanism 42 pulls the second winding mechanism 22 to move in the direction toward the housing 10, i.e. to the left in FIG. 2, to receive the flexible display screen 30 into the second winding mechanism 22.

The first end 31 of the flexible display screen 30 is pulled and received from the first winding mechanism 21 by the first stretching mechanism 41 and the second end 32 of the flexible display screen 30 is pulled and received from the second winding mechanism 22 by the second stretching mechanism 42, thus to control the size of the display surface of the flexible display screen 30 outside the housing 10.

In one embodiment, the flexible display device further includes a limiting plate 50. The limiting plate 50 is disposed on a bottom side of the housing 10 or may be disposed on the lateral side of the housing 10. The limiting plate 50 is located between the first stretching mechanism 41 and the second stretching mechanism 42.

When the first stretching mechanism 41 and the second stretching mechanism 42 slide toward the connecting member 13, in order to avoid excessive sliding distance, the limiting plate 50 is disposed between the first stretching mechanism 41 and the second stretching mechanism 42 to ensure that the first stretching mechanism 41 and the second stretching mechanism 42 are blocked after sliding to appropriate positions, and cannot continue to slide. Accordingly, the two ends of the flexible display screen 30 are protected from colliding with each other to cause damage.

By providing the stretching mechanism and the winding mechanism, the flexible display screen 30 is wound up in the housing 10 when not in use and the flexible display screen 30 is pulled out of the housing 10 when in use to flexibly control the display area of the flexible display screen 30, and the entire flexible display device is smaller in size after storage, and the housing 10 can protect the internal flexible display screen 30 from damage.

In this embodiment, the first winding mechanism 21 includes a first winding member 210, a first roller 211, a second roller 212 and a third roller 213. The second winding mechanism 22 includes a second winding member 220, a fourth roller 221, and a fifth roller 222 and a sixth roller 223. The second winding member 220 corresponds to the first winding member 210, the fourth roller 221 corresponds to the first roller 211, the fifth roller 222 corresponds to the second roller 212, and the sixth roller 223 corresponds to the third roller 213.

Specifically, the number of rollers in the first winding mechanism 21 and the number of rollers in the second winding mechanism 22 are not limited thereto. Each winding mechanism can be provided with only one roller, two rollers, three rollers or more rollers. The number of rollers can be designed according to the size of the receiving cavity 100 in the housing 10. The manner in which the rollers are disposed and the manner in which the flexible display panel 30 is wound are similar to those in FIG. 1 to FIG. 3.

The structures in the first winding mechanism 21 and the second winding mechanism 22 may be the same or different. However, the principle of pulling out and receiving the flexible display screen 30 is the same in the flexible display device.

In one embodiment, the first winding mechanism 21 and the second winding mechanism 22 are identical and symmetric about the center of the housing. Namely, the shape, the size, and the structure of the first winding mechanism 21 and the second winding mechanism 22 are identical. The specific description of the first winding mechanism 21 and the first stretching mechanism 41 in the present application is also applicable to the structure and working principle of the second winding mechanism 22 and the second stretching mechanism 42.

Figure 5:
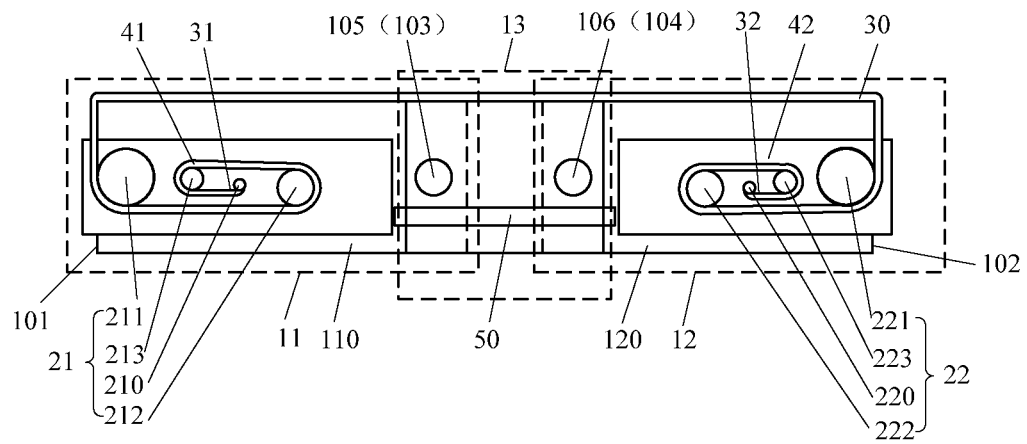
FIG. 5 is a fifth structure diagram of a flexible display device provided by the embodiment of the present application.

As shown in FIG. 5, it is a fifth structure diagram of a flexible display device provided by the embodiment of the present application. The flexible display device includes a housing 10, a winding mechanism, a flexible display screen 30 and a stretching mechanism.

The difference from the structure in FIG. 4 is that, in this embodiment, the housing 10 includes a first housing 11, a second housing 12 and a connecting member 13 connecting the first housing 11 and the second housing 12. The first housing 11 has a first receiving cavity 110 formed therein, and the second housing 12 has a second receiving cavity 120 formed therein. A first opening 101 is formed on a lateral side of the first receiving cavity 110 away from the connecting member 13, and a second opening 102 is formed on a lateral side of the second receiving cavity 110 away from the connecting member 13.

The first housing 11 and the second housing 12 are rotatable around the connecting member 13. In one embodiment, the first housing 11, the second housing 12 and the connecting member 13 are hinged, together.

A first connecting hole 103 is formed on the first housing 11, and a second connecting hole 104 is formed in the second housing 12. A third connecting hole 105 and a fourth connecting hole 106 are formed on the connecting member 13. When the first housing 11 is connected to the connecting member 13, the first connecting hole 103 and the third connecting hole 105 are coincident; when the second housing 12 is connected to the connecting member 13, the second connecting hole 104 and the third connecting hole 105 are coincident. The first housing 11 coincides a partial region of the connecting member 13, and the second housing 12 coincides with a partial region of the connecting member 13.

In the first receiving cavity 110, a first winding mechanism 21 and a first stretching mechanism 41 are disposed therein. In the second receiving cavity 120, a second winding mechanism 22 and a second stretching mechanism 42 are disposed therein. The first stretching mechanism 41 is connected to the first winding mechanism 21, and the second stretching mechanism 42 is connected to the second winding mechanism 22.

A flexible display screen 30 disposed outside the housing. A first end 31 of the flexible display screen 30 extends into the first opening 101 and is connected to the first winding mechanism 21. The second end 32 of the flexible display screen 30 extends into the second opening 102, and is connected to the second winding mechanism 22. Both the first stretching mechanism 41 and the second stretching mechanism 42 are movable in a direction away from the housing 10 and toward the housing 10.

When the flexible display screen 30 is in the first state, the first housing 11 and the second housing 12 are unfolded around the connecting member 13, and the first stretching mechanism 41 pulls the first winding mechanism 21 to move in the direction away from the housing 10, i.e. to the left in FIG. 2, to pull the flexible display screen 30 out of the first winding mechanism 21, and meanwhile, the second stretching mechanism 42 pulls the second winding mechanism 22 to move in the direction away from the housing 10, i.e. to the right in FIG. 2, to pull the flexible display screen 30 out of the second winding mechanism 22.

When the flexible display screen 30 is in the second state, the first stretching mechanism 41 pulls the first winding mechanism 21 to move in the direction toward the housing 10, i.e. to the right in FIG. 2, to receive the flexible display screen 30 into the first winding mechanism 21, and meanwhile, the second stretching mechanism 42 pulls the second winding mechanism 22 to move in the direction toward the housing 10, i.e. to the left in FIG. 2, to receive the flexible display screen 30 into the second winding mechanism 22. The first housing 11 and the second housing 12 are folded around the connecting member 13.

In this embodiment, the first winding mechanism 21 includes a first winding member 210, a first roller 211, a second roller 212 and a third roller 213. The second winding mechanism 22 includes a second winding member 220, a fourth roller 221, and a fifth roller 222 and a sixth roller 223. The second winding member 220 corresponds to the first winding member 210, the fourth roller 221 corresponds to the first roller 211, the fifth roller 222 corresponds to the second roller 212, and the sixth roller 223 corresponds to the third roller 213.

Specifically, the number of rollers in the first winding mechanism 21 and the number of rollers in the second winding mechanism 22 are not limited thereto. Each winding mechanism can be provided with only one roller, two rollers, three rollers or more rollers. The number of rollers can be designed according to the size of the receiving cavity 100 in the housing 10. The manner in which the rollers are disposed and the manner in which the flexible display panel 30 is wound are similar to those in FIG. 1 to FIG. 3.

The structures in the first winding mechanism 21 and the second winding mechanism 22 may be the same or different. However, the principle of pulling out and receiving the flexible display screen 30 is the same in the flexible display device.

In one embodiment, the first winding mechanism 21 and the second winding mechanism 22 are identical and symmetric about the center of the housing. Namely, the shape, the size, and the structure of the first winding mechanism 21 and the second winding mechanism 22 are identical. The specific description of the first winding mechanism 21 and the first stretching mechanism 41 in the present application is also applicable to the structure and working principle of the second winding mechanism 22 and the second stretching mechanism 42.

In one embodiment, the flexible display device further includes a limiting plate 50. The limiting plate 50 is disposed on a bottom side of the housing 10 or may be disposed on the lateral side of the housing 10. The limiting plate 50 is located between the first stretching mechanism 41 and the second stretching mechanism 42.

When the first stretching mechanism 41 and the second stretching mechanism 42 slide toward the connecting member 13, in order to avoid excessive sliding distance, the limiting plate 50 is disposed between the first stretching mechanism 41 and the second stretching mechanism 42 to ensure that the first stretching mechanism 41 and the second stretching mechanism 42 are blocked after sliding to appropriate positions, and cannot continue to slide. Accordingly, the two ends of the flexible display screen 30 are protected from colliding with each other to cause damage.

Figure 6:
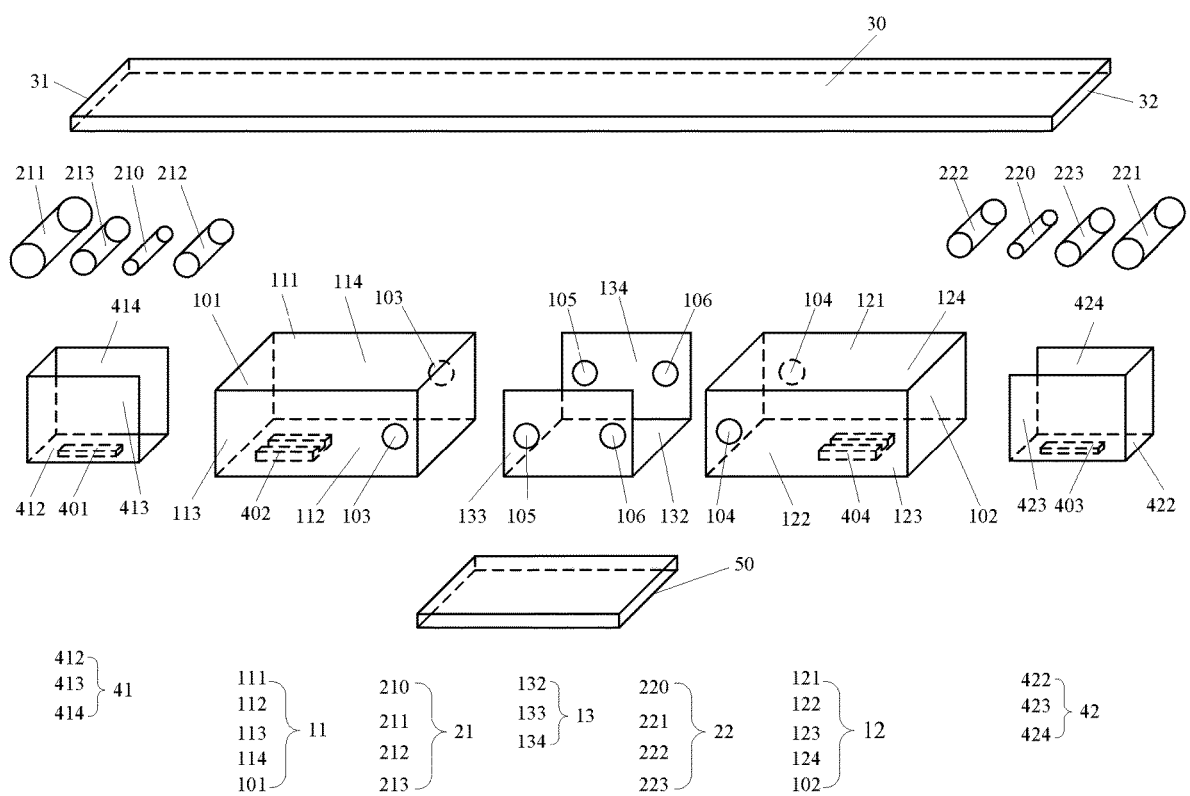
FIG. 6 is a first exploded view diagram of the fifth structure of the flexible display device provided by the embodiment of the present application.

As shown in FIG. 6, it is a first exploded view diagram of the fifth structure of the flexible display device provided by the embodiment of the present application. The structure of each portion of the flexible display device will be specifically described below with reference to FIG. 5 to FIG. 15.

The first housing 11 is generally a hollow cubic structure that internally forms the first receiving cavity 110, including a first top side 111, a first bottom side 112, and a first lateral side 113 and a second lateral side 114 connected to the first top side 111 and the first bottom side 112. A first opening 101 is formed on a side of the first housing 11 away from the connecting member 13, and a size of the first opening 101 is smaller than or equal to a size of the lateral side of the housing. The side of the first housing 11 close to the connecting member 13 may or may not be provided with a lateral side.

In one embodiment, no lateral side is provided on the side of the first housing 11 away from the connecting member 13, where the first opening 101 is formed directly.

In one embodiment, one lateral side is provided on the side of the first housing 11 away from the connecting member 13, first. Then, the first opening 101 is formed by digging holes on the lateral side, and the shape and the size of the first opening 101 can be designed as needed.

In one embodiment, the first bottom side 112 may not be disposed. Namely, the first housing 11 only includes the first top side 111, the first lateral side 113 and the second lateral side 114.

The first lateral side 113 of the first housing 11 is provided with a first connecting hole 103 penetrating to the second lateral side 114.

The second housing 12 is generally a hollow cubic structure that internally forms the second receiving cavity 120, including a second top side 121, a second bottom side 122, and a third lateral side 123 and a fourth lateral side 124 connected to the second top side 121 and second bottom side 122. A second opening 102 is formed on a side of the second housing 12 away from the connecting member 13, and a size of the second opening 102 is smaller than or equal to a size of the lateral side of the housing. The side of the second housing 12 close to the connecting member 13 may or may not be provided with a lateral side.

In one embodiment, no lateral side is provided on the side of the second housing 12 away from the connecting member 13, where the second opening 102 is formed directly.

In one embodiment, one lateral side is provided on the side of the second housing 12 away from the connecting member 13, first. Then, the second opening 102 is formed by digging holes on the lateral side, and the shape and the size of the second opening 102 can be designed as needed.

In one embodiment, the second bottom side 122 may not be disposed. Namely, the second housing 12 only includes the second top side 121, the third lateral side 123 and the fourth lateral side 124.

Similarly, the second lateral side 123 of the second housing 12 is provided with a second connecting hole 104 penetrating to the fourth lateral side 124.

The connecting member 13 is for connecting the first housing 11 and the second housing 12, and the first housing 11 and the second housing 12 are rotatable around the connecting member 13 in an unfolded state or a folded state. In this embodiment, the connecting member 13 is a U-shaped structure, including a connecting bottom side 132, a first connecting lateral side 133 and a second connecting lateral side 134. The first connecting lateral side 133 is provided with a third connecting hole 105 and a fourth connecting hole 106 penetrating to the second connecting lateral side 134.

Figure 7:
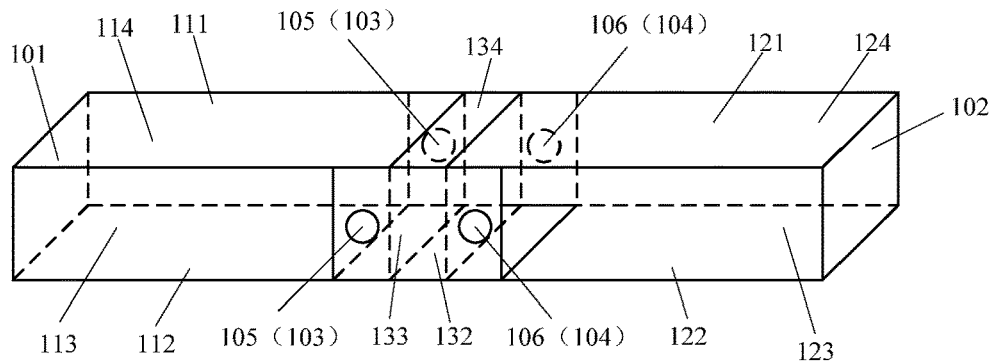
FIG. 7 is a connection diagram of a housing in the fifth structure of the flexible display device provided by the embodiment of the present application.
Figure 7:
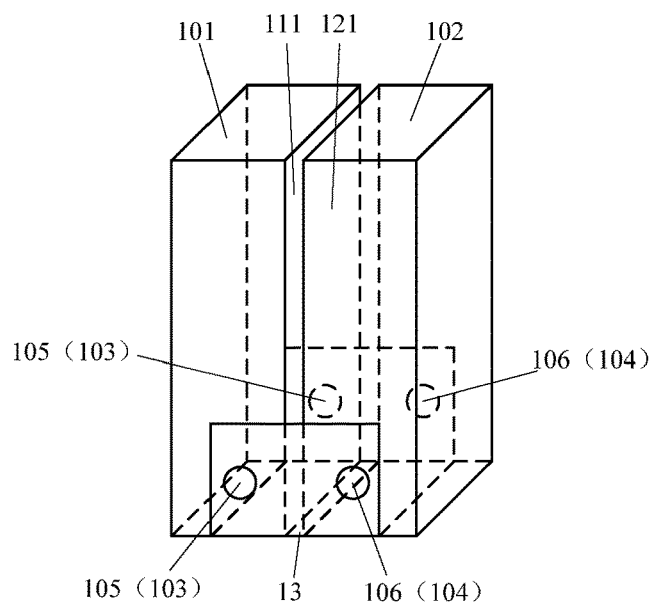

The connecting member 13 connects the first housing 11 and the second housing 12 together, and the specific connecting structure is shown in FIG. 7.

As shown in FIG. 7a, the first connecting hole 103 of the first housing 11 is aligned with the third connecting hole 105 of the connecting member 13, and the second connecting hole 104 of the second housing 12 is aligned with the fourth connecting hole 106 of the connecting member 13. The aligned holes may be fixed by hinge members (not shown), which may be bolts or the like. After the fixing, the first housing 11 is rotatable clockwise around the connecting member 13, and the second housing 12 is rotatable counterclockwise about the connecting member 13. Then, the first housing 11 coincides a partial region of the connecting member 13, and the second housing 12 coincides with a partial region of the connecting member 13.

When the flexible display screen 30 is in the first state, that is, the flexible display screen 30 needs to display, the first housing 11 and the second housing 12 are unfolded around the connecting member 13. As being unfolded, the first top side 111 of the first housing 11 and the second top side 121 of the second housing 112 are in the same horizontal plane.

As shown in FIG. 7b, when the flexible display screen 30 is in the second state, that is, the flexible display screen 30 does not need to display but needs to be received, the first housing 11 and the second housing 12 are folded around the connecting member 13. Namely, the first housing 11 is rotated 90 degrees clockwise around the connecting member 13, and the second housing 12 is rotated 90 degrees counterclockwise around the connecting member 13 until the first top side 111 of the first housing 11 and the second top side 121 of the housing 12 are parallel.

Certainly, the structure of the connecting member 13 is not limited to this. Other structures that can connect the first housing 11 and the second housing 12 and ensure that the first housing 11 and the second housing 12 are rotatable, unfolded and folded can be used as the connecting member 13 of the present application.

As shown in FIG. 5 and FIG. 6, the flexible display device includes a first stretching mechanism 41 and a second stretching mechanism 42. In this embodiment, the first stretching mechanism 41 is a drawer. The drawer is placed within the first receiving cavity 110 and can be pushed in and pulled out of the first housing 11 through the first opening 101. A first slider 401 is disposed on the first stretching mechanism 41, and a corresponding first slide rail 402 is disposed on the first housing 11, and the first slider 401 slides along the first slide rail 402.

Figure 8:
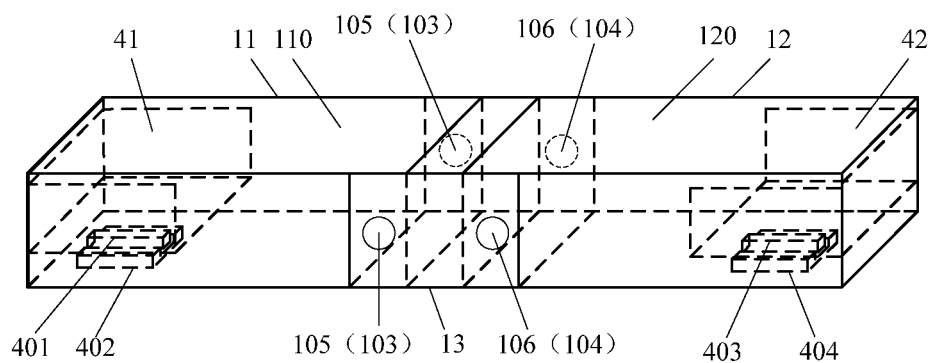
FIG. 8 is a first connection diagram of the stretching mechanism and the housing in the fifth structure of the flexible display device provided by the embodiment of the present application.

As shown in FIG. 8, a height of the first stretching mechanism 41 is smaller than a height of the first housing 11. The first stretching mechanism 41 is mounted in the first slide rail 402 of the first housing 11 through the first slider 401. The first slider 401 may specifically be a draw slip, a pulley or other member that can slide in the first slide rail 402. The first stretching mechanism 41 is movable along the first slide rail 402 in the direction away from the connecting member 13 and in the direction toward the connecting member 13.

In one embodiment, the first slider 401 is disposed under a third bottom side 412 of the first stretching mechanism 41. Optionally, only one first slider 401 may be provided, or two or more first sliders 401 may be provided. The first slide rail 402 is disposed on the first bottom side 112 of the first housing 11, and the number and position of the first slide rails 402 correspond to those of the first sliders 401.

In one embodiment, the first slider 401 is disposed on a fifth side 413 or a sixth side 414 of the first stretching mechanism 41. Optionally, only one first slider 401 may be provided, or two or more first sliders 401 may be provided. The first slide rail 402 is correspondingly disposed on the first side 113 or the second side 114 of the first housing 11. The number and position of the first slide rails 402 correspond to those of the first sliders 401.

In one embodiment, both the fifth side 413 and the sixth side 414 of the first stretching mechanism 41 are both provided with the first slider 401, and only one first slider 401 may be provided, or two or more first sliders 401 may be provided on each side. The first slide rails 402 are correspondingly disposed on the first side 113 and the second side 114 of the first housing 11. The number and position of the first slide rails 402 correspond to those of the first sliders 401.

In one embodiment, a pull rod (not shown) is further disposed on the first stretching mechanism 41. When the first stretching mechanism 41 is pushed in or pulled out of the first housing 11, the pull rod can be pushed or pulled to perform the operation.

Similarly, a height of the second stretching mechanism 42 is smaller than a height of the second housing 12. The second stretching mechanism 42 is mounted in the second slide rail 404 of the second housing 12 through the second slider 403. The second slider 403 may specifically be a draw slip, a pulley or other member that can slide in the second slide rail 404. The second stretching mechanism 42 is movable along the second slide rail 404 in the direction away from the connecting member 13 and in the direction toward the connecting member 13.

In one embodiment, the second slider 403 is disposed under a fourth bottom side 412 of the second stretching mechanism 42. Optionally, only one second slider 403 may be provided, or two or more second sliders 403 may be provided. The second slide rail 404 is disposed on the second bottom side 122 of the second housing 12, and the number and position of the second slide rails 404 correspond to those of the second sliders 403.

In one embodiment, both the seventh side 423 and the eighth side 424 of the second stretching mechanism 42 are both provided with the second slider 403, and only one second slider 403 may be provided, or two or more second sliders 403 may be provided on each side. The second slide rails 404 are correspondingly disposed on the third side 123 and the fourth side 124 of the second housing 12. The number and position of the second slide rails 404 correspond to those of the second sliders 403.

In one embodiment, both the seventh side 423 and the eighth side 424 of the second stretching mechanism 42 are both provided with the second slider 403, and only one second slider 403 may be provided, or two or more second sliders 403 may be provided on each side. The second slide rails 404 are correspondingly disposed on the third side 123 and the fourth side 124 of the second housing 12. The number and position of the second slide rails 404 correspond to those of the second sliders 403.

In one embodiment, a pull rod (not shown) is further disposed on the second stretching mechanism 42. When the second stretching mechanism 42 is pushed in or pulled out of the second housing 12, the pull rod can be pushed or pulled to perform the operation.

Figure 9:
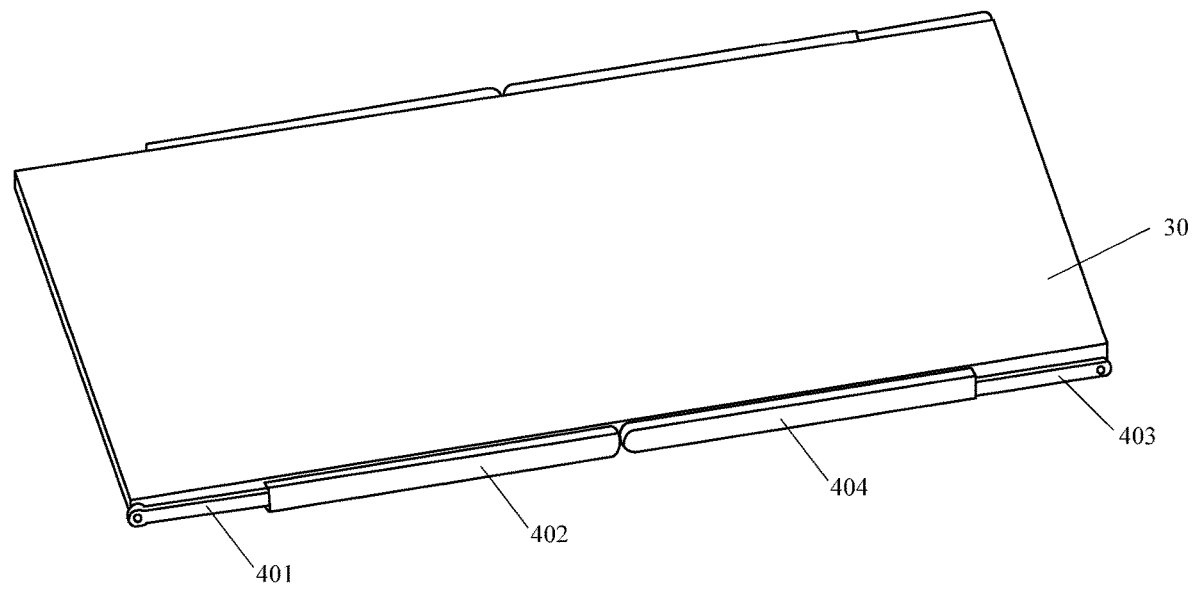
FIG. 9 is a second connection diagram of the stretching mechanism and the housing in the fifth structure of the flexible display device provided by the embodiment of the present application.
Figure 9:
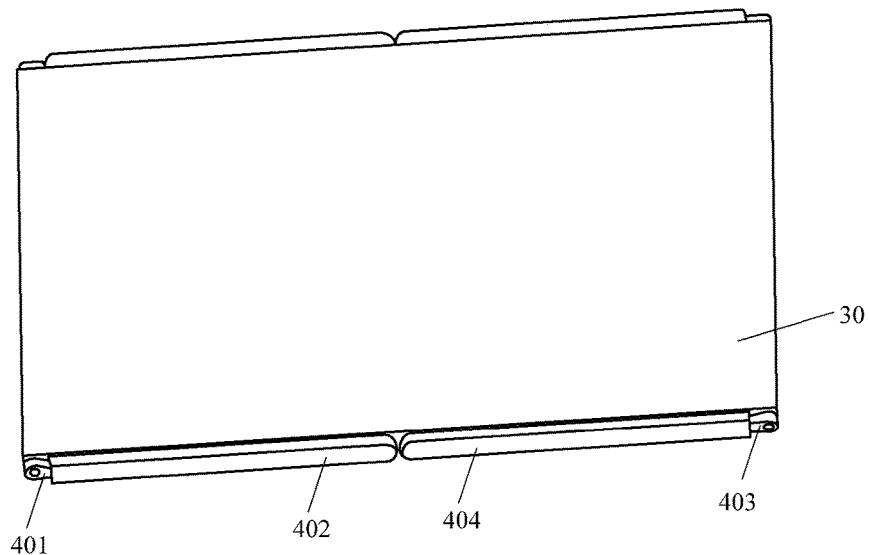

The connection diagram of the stretching mechanism and the housing in FIG. 8 is a schematic structural diagram, and the actual connection diagram is as shown in FIG. 9. The first stretching mechanism 41 on the left side is provided with the first slider 401, and the first housing 11 has the first slide rail 402 therein. The second stretching mechanism 42 on the right side is provided with the second slider 403, and the second housing 12 has the second slide rail 404 therein.

As shown in FIG. 9a, when the flexible display screen 30 needs to be pulled out, the first stretching mechanism 41 slides along the first slide rail 402 to the left, and the first slider 401 gradually slides out of the first slide rail 402, and the second stretching mechanism 42 slides along the second slide rail 404 to the right, and the second slider 403 gradually slides out of the second slide rail 404. The first stretching mechanism 41 and the second stretching mechanism 42 drive the flexible display screen 30 to be pulled out to increase the display area of the flexible display screen 30.

As shown in FIG. 9b, when the flexible display screen 30 needs to be received, the first stretching mechanism 41 slides along the first slide rail 402 to the right, and the first slider 401 gradually slides into the first slide rail 402, and the second stretching mechanism 42 slides along the second slide rail 404 to the left, and the second slider 403 gradually slides into the second slide rail 404. The first stretching mechanism 41 and the second stretching mechanism 42 drive the flexible display screen 30 to be retracted.

As shown in FIG. 6, the first winding mechanism 21 is fixed in the first stretching mechanism 41. Specifically, the first roller 211, the second roller 212 and the third roller 213 are fixed in the first stretching mechanism 41. Since the first stretching mechanism 41 is a drawer structure, the first roller 211, the second roller 212 and the third roller 213 have a cylindrical structure. The two end faces of the respective rollers may be fixed to the fifth side 413 and the sixth side 414 of the first stretching mechanism 41, respectively.

The second winding mechanism 22 is fixed in the second stretching mechanism 42. Specifically, the fourth roller 221, the fifth roller 222 and the sixth roller 223 are fixed in the second stretching mechanism 42. Since the second stretching mechanism 42 is a drawer structure, the fourth roller 221, the fifth roller 222 and the sixth roller 223 have a cylindrical structure. The two end faces of the respective rollers may be fixed to the seventh side 423 and the eighth side 424 of the second stretching mechanism 42, respectively.

Figure 10:
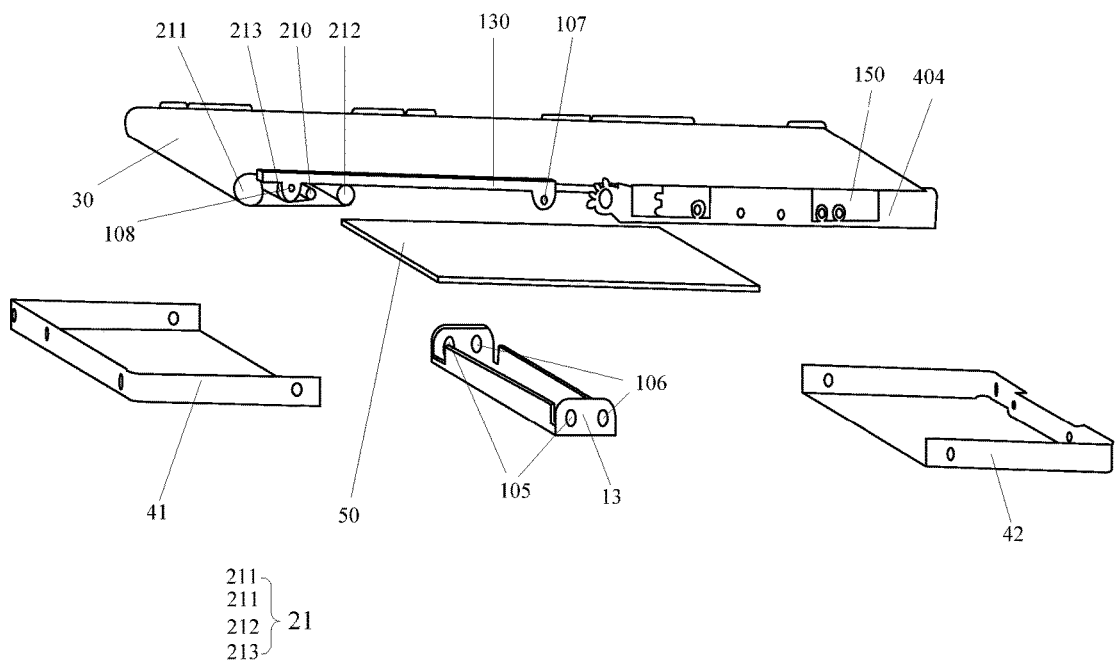
FIG. 10 is a second exploded view diagram of the fifth structure of the flexible display device provided by the embodiment of the present application.

The exploded view diagram of the fifth structure of the flexible display device shown in FIG. 6 is only a structural diagram, and the exploded view diagram of the components of the flexible display device is actually shown in FIG. 10. The first housing 11 includes a first fixing member 130. The first fixing member 130 may be disposed on the side of the first housing 11 or may be formed directly with the side, that is, the first fixing member 130 itself constitutes the lateral side of the first housing 11.

The first fixing member 130 is formed with a first fixing hole 107 and a second fixing hole 108. The first fixing hole 107 corresponds to the first connecting hole 103 in FIG. 6.

The first fixing hole 107 is aligned and hinged with the third connecting hole 105 on the connecting member 13 such that the first housing 11 is rotatable around the connecting member 13. The second fixing hole 108 can be used to connect the first slide rail 402, and the first slider 401 on the first stretching mechanism 41 can slide back and forth along the first slide rail 402. The right side of FIG. 10 is an internal structure of the second slide rail 404 disposed on the lateral side of the second housing 12. The second slide rail 404 can be fixed by a second fixing member (not shown). The second fixing member has the same structure and principle as those of the first fixing member 130. The fixing hole of the second fixing member is aligned and hinged with the fourth connecting hole 106 on the connecting member such that the second housing 12 is rotatable around the connecting member 13. The second slider 403 on the second stretching mechanism 42 slides back and forth along the second slide rail 404. A limiting block 150 is further disposed on the second slide rail 404. When the second slider 403 slides through the position of the limiting block 150, the limiting block 150 can provide a resistance for the second stretching mechanism 42 to stop sliding at the position. The number and spacing of the limiting blocks 150 can be set as needed.

Figure 11:
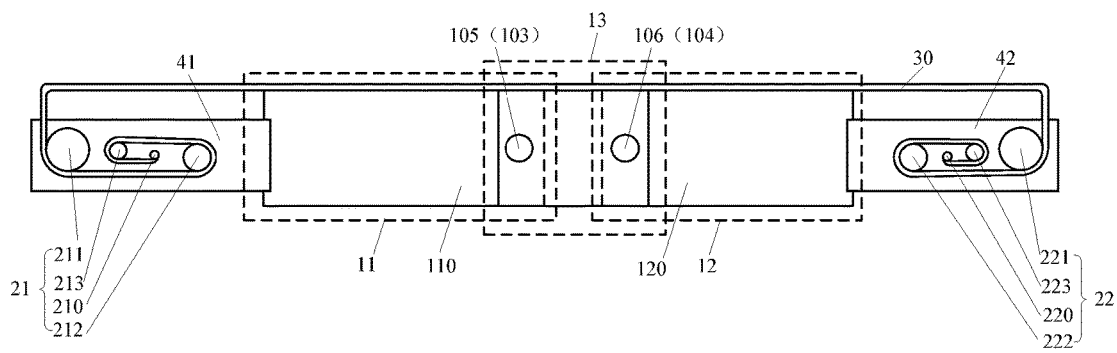
FIG. 11 is a first state diagram of the fifth structure of the flexible display device provided by the embodiment of the present application.

As shown in FIG. 11, it is a first state diagram of the fifth structure of the flexible display device provided by the embodiment of the present application.

When the flexible display screen 30 is in the first state, that is, when the flexible display screen 30 needs to display, the first housing 11 and the second housing 12 are first unfolded around the connecting member 13. As being unfolded, the first top side 111 of the first housing 11 and the second top side 121 of the second housing 112 are in the same horizontal plane. The flexible display screen 30 is laid on the first top side 111 of the first housing 11 and the second top side 121 of the second housing 112.

Then, the first stretching mechanism 41 slides in the direction away from the connecting member 13, and the first winding mechanism 21 fixed thereto also slides in the direction away from the connecting member 13. Then, the first winding member 210 gradually releases the flexible display screen 30 wound therein. The distance by which the first stretching mechanism 41 slides in the direction away from the connecting member 13 is the length at which the first end 31 of the flexible display screen 30 is pulled out.

Meanwhile, the second stretching mechanism 42 also slides in the direction away from the connecting member 13, and the second winding mechanism 22 fixed thereto also slides in the direction away from the connecting member 13. Then, the second winding member 220 gradually releases the flexible display screen 30 wound therein. The distance by which the second stretching mechanism 42 slides in the direction away from the connecting member 13 is the length at which the second end 32 of the flexible display screen 30 is pulled out.

Figure 12:
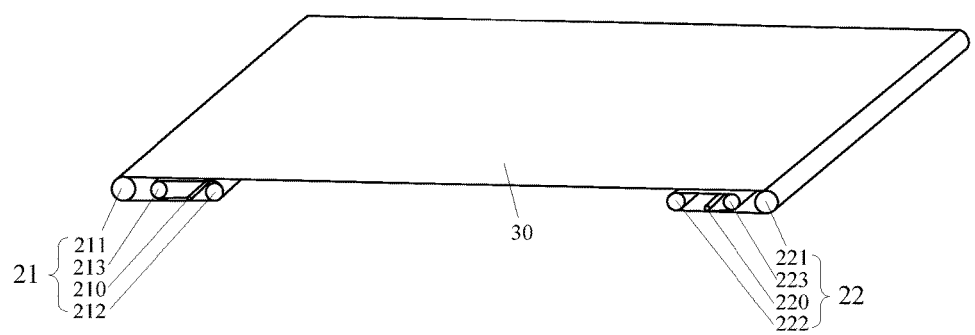
FIG. 12 is a diagram of a flexible display screen in the first state of the fifth structure of the flexible display device provided by the embodiment of the present application.

As shown in FIG. 12, it is a diagram of a flexible display screen in the first state of the fifth structure of the flexible display device provided by the embodiment of the present application. As shown in FIG. 11, after unfolding the first housing 11 and the second housing 12 and stretching the first stretching mechanism 41 and the second stretching mechanism 42, the final display area length of the flexible display screen 30 is approximately equal to a sum of a length of the first top side 111 of the first housing 11, a length of the second top side 121 of the second housing 12, a distance that the first stretching mechanism 41 slides in the direction away from the connecting member 13 and a distance that the second stretching mechanism 42 slides in the direction away from the connecting member 13. The flexible display screen 30 presents a larger display area.

Thereby, a larger screen can be exhibited when the flexible display screen 30 needs to display for enhancing the display effect and user experience.

Figure 13:
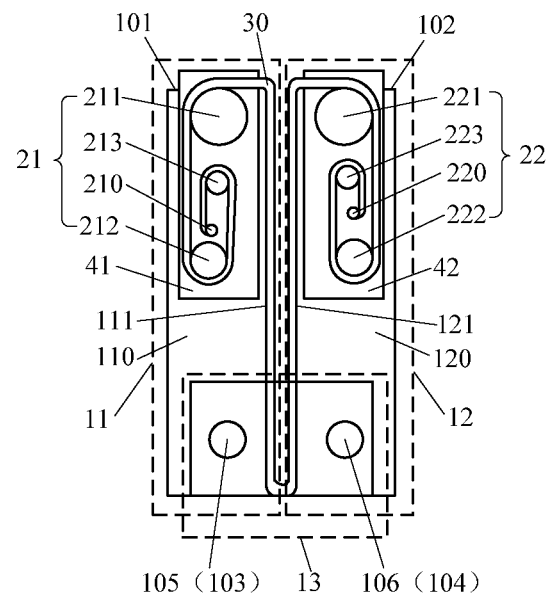
FIG. 13 is a second state diagram of the fifth structure of the flexible display device provided by the embodiment of the present application.

As shown in FIG. 13, it is a second state diagram of the fifth structure of the flexible display device provided by the embodiment of the present application.

When the flexible display screen 30 is in the second state, that is, the flexible display screen 30 does not need to display but needs to be received, the first stretching mechanism 41 first slides in the direction toward the connecting member 13, and the first winding mechanism 21 fixed thereto also slides in the direction toward the connecting member 13. Then, the first winding member 210 gradually winds up the excess flexible display screen 30, and the distance that the first stretching mechanism 41 slides in the direction toward the connecting member 13 is the length at which the first end 31 of the flexible display screen 30 is wound up. When the first stretching mechanism 41 is fully pushed into the first housing 11, the flexible display screen 30 is disposed only on the first top side 111 of the first housing 11. The rest of the flexible display screen 30 is wound into the first winding mechanism 21 and hidden in the first stretching mechanism 41.

Meanwhile, the second stretching mechanism 42 also slides in the direction toward the connecting member 13, and the second winding mechanism 22 fixed thereto also slides in the direction toward the connecting member 13. Then, the second winding member 220 gradually winds up the excess flexible display screen 30, and the distance that the second stretching mechanism 42 slides in the direction toward the connecting member 13 is the length at which the second end 32 of the flexible display screen 30 is wound up. When the second stretching mechanism 42 is fully pushed into the second housing 12, the flexible display screen 30 is disposed only on the second top side 121 of the second housing 12. The rest of the flexible display screen 30 is wound into the second winding mechanism 22 and hidden in the second stretching mechanism 42.

Then, the first housing 11 and the second housing 12 are folded around the connecting member 13. Namely, the first housing 11 is rotated 90 degrees clockwise around the connecting member 13, and the second housing 12 is rotated 90 degrees counterclockwise around the connecting member 13 until the first top side 111 of the first housing 11 and the second top side 121 of the housing 12 are parallel. Then, the flexible display screen 30 laid on the first top side 111 of the first housing 11 and the second top side 121 of the second housing 112 is folded with the rotation of the first housing 11 and the second top side 121 to be received inwards in the gap formed by the first top side 111 of the first housing 11 and the second top side 121 of the second housing 112.

Figure 14:
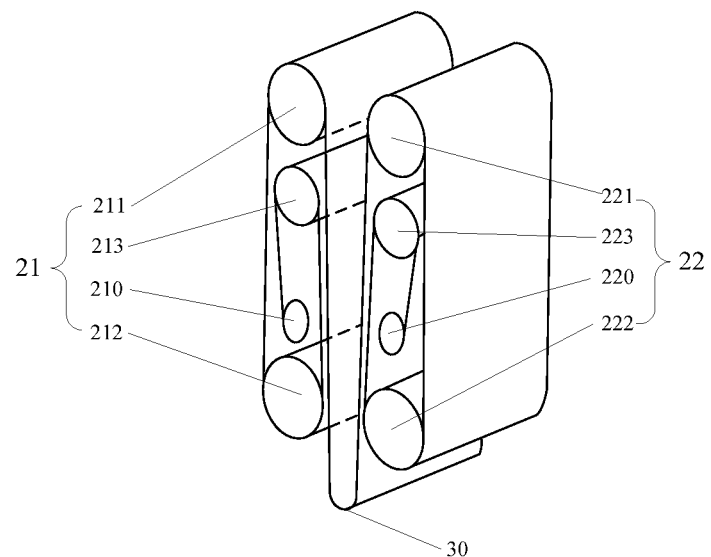
FIG. 14 is a diagram of the flexible display screen in the second state of the fifth structure of the flexible display device provided by the embodiment of the present application.

As shown in FIG. 14, it is a diagram of the flexible display screen in the second state of the fifth structure of the flexible display device provided by the embodiment of the present application. As shown in FIG. 13, after retracting the first stretching mechanism 41 and the second stretching mechanism 42 and folding of the first housing 11 and the second housing 12, the display area of the flexible display screen 30 can be folded inwardly. Such manner does not only make the entire flexible display device smaller and more portable but the first housing 11 and the second housing 12 also can better protect the internal flexible display screen 30 from damage.

Figure 15:
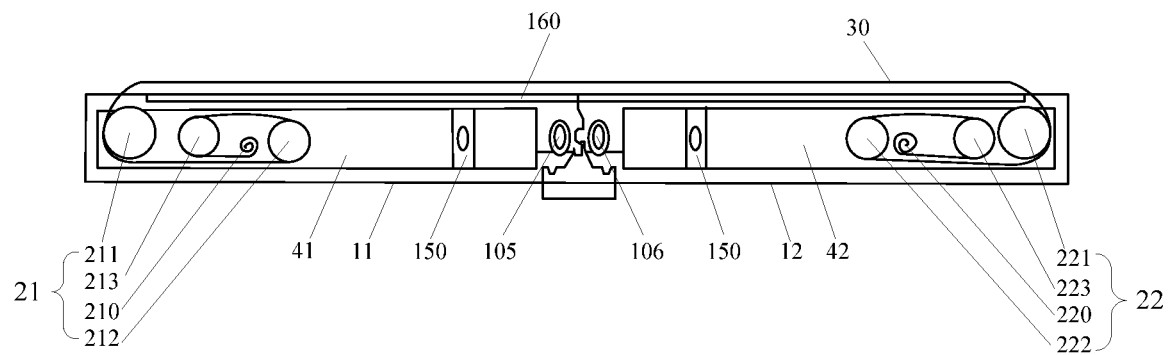
FIG. 15 is a sixth structural diagram of a flexible display device provided by the embodiment of the present application.
Figure 15:
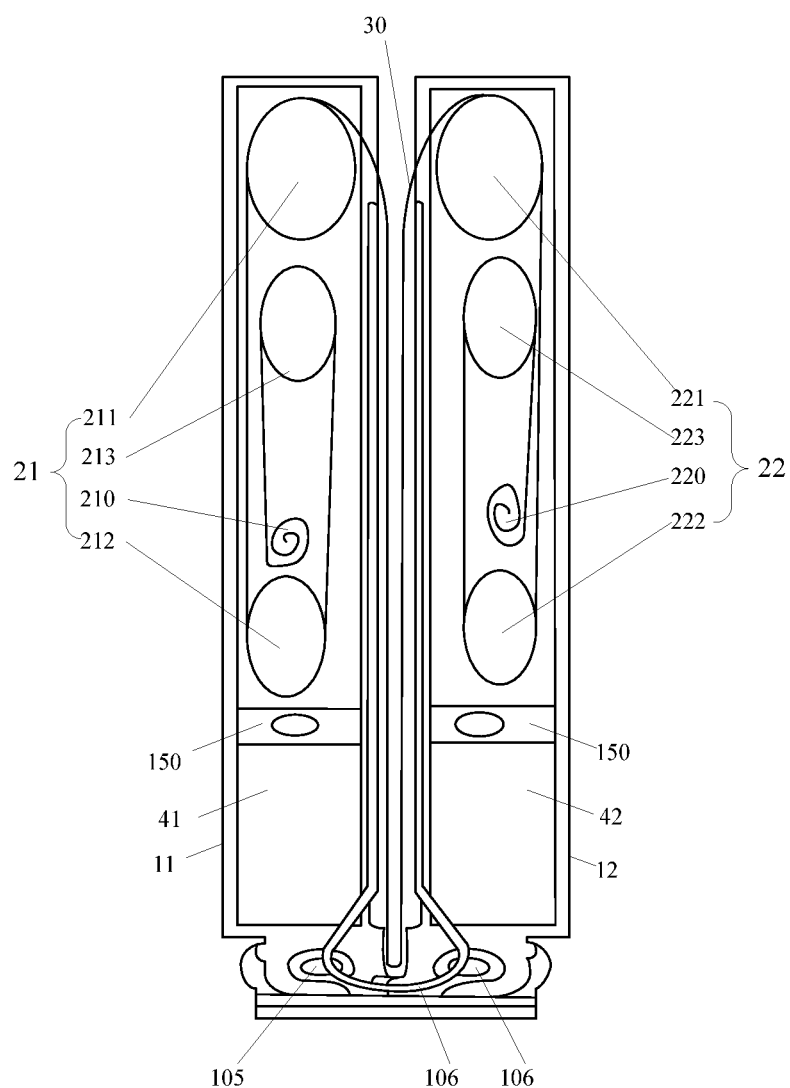

As shown in FIG. 15, the flexible display device further includes an elastic member 160. The elastic member 160 penetrates the first housing 11 and the second housing 12. As shown in FIG. 15a, when the first housing 11 and the second housing 12 are unfolded, the elastic member 160 is parallel to the top side of the first housing 11 and top side of the second housing 12. As shown in FIG. 15b, when the first housing 11 and the second housing 12 are folded, the elastic member 160 is also folded. At the junction of the first housing 11 and the second housing 12, the elastic member 160 has an arc structure. The arc structure provides a locking force to maintain the first housing 11 and the second housing 12 in a folded state, and is not separated from each other when external force is not applied, and external impurities are not allowed to enter, thereby protecting the flexible display screen 30 therein not to be damaged. When the first housing 11 and the second housing 12 needs to be re-unfolded, it is necessary to apply a certain external force to separate the first housing 11 and the second housing 12, and then the elastic member 160 also returns from the bent state to the unfolded state.

In one embodiment, the flexible display device further includes a support layer (not shown). The flexible display screen 30 is disposed on the support layer. An area of the flexible display screen 40 may be equal to an area of the support layer or may be smaller than the area of the support layer. When the flexible display screen 30 is switched between the first state and the second state, the support layer can be used to protect the flexible display screen 30 from damage to the flexible display screen 30 during stretching.

The support layer is usually a rectangular structure, and its bending and curling properties are good, and the amount of stretching is small under a certain tensile force. Generally, the support layer is made of stainless steel or amorphous material. In one embodiment, the support layer has a thickness of 30 microns.

The flexible display device further includes an adhesive layer (not shown), and the adhesive layer is disposed between the support layer and the flexible display screen 30, and the flexible display screen 30 is fixed to the support layer by the adhesive layer. A material of the adhesive layer may be optical glue. The flexible display screen 30 and the support layer are adhered by curing the adhesive layer. However, the present application is not limited thereto, and other materials that can fix the flexible display screen 30 on the support layer can form the adhesive layer.

By providing the stretching mechanism, the winding mechanism and the connecting member 13, the flexible display screen 30 is wound up and folded in the housing 10 when not in use and the flexible display screen 30 is pulled out of the housing 10 and unfolded when in use to flexibly control the display area of the flexible display screen 30, and the entire flexible display device is smaller in size after storage, and the housing 10 can protect the internal flexible display screen 30 from damage.

It can be known according to the aforesaid embodiment: the present application provides a flexible display device, including a housing, at least one winding mechanism, a flexible display screen and at least one stretching mechanism, wherein a receiving cavity is formed in the housing, and an opening is formed on at least one of two opposite side edges of the receiving cavity; at least one winding mechanism disposed in the receiving cavity; the flexible display screen disposed outside the housing, wherein one end of the flexible display screen extends into the opening and is connected to the winding mechanism; at least one stretching mechanism disposed in the receiving cavity, wherein each of the stretching mechanisms is connected to one of the winding mechanisms; wherein when the flexible display screen is in a first state, the stretching mechanism pulls the winding mechanism to move in a direction away from the housing to pull the flexible display screen out of the winding mechanism; when the flexible display screen is in a second state, the stretching mechanism pulls the winding mechanism to move in a direction toward the housing to receive the flexible display screen into the winding mechanism. By providing the stretching mechanism and the winding mechanism, the flexible display screen is wound up in the housing when not in use, the entire flexible display device is smaller in size, and the housing can protect the internal flexible display screen from damage.

In summary, although the above preferred embodiments of the present application are disclosed, the foregoing preferred embodiments are not intended to limit the invention, and those skilled in the art can make various kinds of alterations and modifications without departing from the spirit and scope of the present application. Thus, the scope of protection of the present application is defined by the scope of the claims.

What is claimed is:

1. A flexible display device, comprising:
   a housing having a receiving cavity formed therein, wherein an opening is formed on at least one of two opposite side edges of the receiving cavity;
   at least one winding mechanism disposed in the receiving cavity;
   a flexible display screen disposed outside the housing, wherein one end of the flexible display screen extends into the opening and is connected to the winding mechanism; and
   at least one stretching mechanism disposed in the receiving cavity, wherein each of the stretching mechanisms is connected to one of the winding mechanisms;
   wherein when the flexible display screen is in a first state, the stretching mechanism pulls the winding mechanism to move in a direction away from the housing to pull the flexible display screen out of the winding mechanism; when the flexible display screen is in a second state, the stretching mechanism pulls the winding mechanism to move in a direction toward the housing to receive the flexible display screen into the winding mechanism;
   wherein the opening is configured as a first opening formed on one side of the receiving cavity; and the winding mechanism comprises a first winding member and a first roller having parallel axes and not contacting each other, and the first roller is disposed between the first winding member and the first opening, and the first winding member and the first roller are fixed on the stretching mechanism, and one end of the flexible display screen is connected to the first winding member around the first roller and extends from the first opening out of the housing; and
   wherein the winding mechanism further comprises a second roller, and the second roller and the first roller are disposed on two sides of the first winding member, and a distance between the second roller and the first opening is greater than a distance of the first roller from the first opening, and the axis of the first roller and an axis of the second roller are parallel, and the one end of the flexible display screen is connected to the first winding member around the second roller and the first roller in sequence and extends from the first opening out of the housing.

2. The flexible display device according to claim 1, wherein the first winding member is a coil spring.

3. The flexible display device according to claim 1, wherein the winding mechanism further comprises a driving member, and the drive member drives the first winding member to pull or retract the flexible display screen.

4. The flexible display device according to claim 1, wherein a diameter of the first roller is equal to or greater than a diameter of the second roller.

5. The flexible display device according to claim 1, wherein the winding mechanism further comprises a third roller, and the third roller is disposed between the first roller and the first winding member, and an axis of the third roller and the axis of the first roller are parallel, and the one end of the flexible display screen is connected to the first winding member around the third roller, the second roller and the first roller in sequence and extends from the first opening out of the housing.

6. The flexible display device according to claim 5, wherein a diameter of the third roller is less than or equal to a diameter of the second roller.

7. The flexible display device according to claim 1, wherein the flexible display device further comprises a limiting plate disposed on a bottom side of the housing.

8. The flexible display device according to claim 1, wherein the flexible display device further comprises a support layer, and the flexible display screen is disposed on the support layer.

9. The flexible display device according to claim 8, wherein a thickness of the support layer is 30 microns.

10. The flexible display device according to claim 8, wherein a material of the support layer is stainless steel.

11. The flexible display device according to claim 8, wherein the flexible display device further comprises an adhesive layer, and the adhesive layer is disposed between the support layer and the flexible display screen, and the flexible display screen is fixed to the support layer by the adhesive layer.

12. The flexible display device according to claim 11, wherein a material of the adhesive layer is optical glue.

13. A flexible display device, comprising:
a housing having a receiving cavity formed therein, wherein an opening is formed on at least one of two opposite side edges of the receiving cavity;
at least one winding mechanism disposed in the receiving cavity;
a flexible display screen disposed outside the housing, wherein one end of the flexible display screen extends into the opening and is connected to the winding mechanism; and
at least one stretching mechanism disposed in the receiving cavity, wherein each of the stretching mechanisms is connected to one of the winding mechanisms;
wherein when the flexible display screen is in a first state, the stretching mechanism pulls the winding mechanism to move in a direction away from the housing to pull the flexible display screen out of the winding mechanism; when the flexible display screen is in a second state, the stretching mechanism pulls the winding mechanism to move in a direction toward the housing to receive the flexible display screen into the winding mechanism; and
wherein the housing comprises a first housing, a second housing and a connecting member connecting the first housing and the second housing, and a first receiving cavity is formed inside the first housing and a second receiving cavity is formed inside the second housing, and at least one of the first receiving cavity and the second receiving cavity is formed with the opening on a side away from the connecting member, wherein when the flexible display screen is in the first state, the first housing and the second housing are unfolded around the connecting member, and when the flexible display screen is in the second state, the first housing and the second housing are folded around the connecting member.

14. The flexible display device according to claim 13, wherein the stretching mechanism is a drawer, and a slider is disposed on the drawer, and a corresponding slide rail is disposed on the housing, and the slider slides along the slide rail.

15. The flexible display device according to claim 14, wherein the slider is a draw slip or a pulley.

16. The flexible display device according to claim 14, wherein the slide rail is disposed on a bottom side of the housing.

17. The flexible display device according to claim 14, wherein the slide rail is disposed on a bottom side of the housing.

18. The flexible display device according to claim 14, wherein the slide rail is disposed on a bottom side of the housing.

* * * * *